US 6,708,372 B2

(12) United States Patent
Stewart

(10) Patent No.: US 6,708,372 B2
(45) Date of Patent: Mar. 23, 2004

(54) SNAP-IN FAN TRAY EJECTOR AND HANDLE

(75) Inventor: Thomas E. Stewart, Saratoga, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 1 day.

(21) Appl. No.: 10/160,927

(22) Filed: May 30, 2002

(65) Prior Publication Data

US 2003/0221291 A1 Dec. 4, 2003

(51) Int. Cl.[7] ............................................. A45C 13/22
(52) U.S. Cl. .............................. 16/422; 16/429; 16/438
(58) Field of Search ........................ 16/422, 429, 438, 16/268; 74/528, 543–548; 165/80.1, 80.3; 361/694, 695, 724–727, 732, 754, 755, 756, 759, 798, 801–803; 417/423.14, 424.2; 454/184

(56) References Cited

U.S. PATENT DOCUMENTS

| | | | | |
|---|---|---|---|---|
| 4,294,134 A | * | 10/1981 | Mori et al. | 74/547 |
| 4,663,802 A | * | 5/1987 | Kunzler | 16/408 |
| 5,400,473 A | * | 3/1995 | Delman | 16/429 |
| 5,551,125 A | * | 9/1996 | Adams | 16/229 |
| 5,560,082 A | * | 10/1996 | Vetter | 16/429 |
| 5,926,370 A | * | 7/1999 | Cromwell | 361/700 |
| 5,940,288 A | * | 8/1999 | Kociecki | 363/144 |
| 6,003,689 A | * | 12/1999 | Babineau et al. | 211/41.17 |
| 6,007,169 A | * | 12/1999 | Li et al. | 312/223.2 |
| 6,160,717 A | * | 12/2000 | Desousa et al. | 361/798 |
| 6,185,106 B1 | * | 2/2001 | Mueller | 361/798 |
| 6,233,784 B1 | * | 5/2001 | Daoud | 16/257 |
| 6,285,548 B1 | * | 9/2001 | Hamlet et al. | 361/695 |

* cited by examiner

Primary Examiner—Chuck Y. Mah
(74) Attorney, Agent, or Firm—O'Melveny & Myers LLP

(57) ABSTRACT

A handle for ejecting a fan tray from an electronics enclosure comprises an elongated lever arm and a pair of opposing spring tabs extending from the lever arm disposed at an end of the lever arm. In an embodiment of the invention, the handle further includes a first bushing protruding from one of the opposing spring tabs and a second bushing protruding from a second one of the opposing spring tabs. The first bushing and the second bushing define a pivot axis substantially perpendicular to a long axis of the elongated lever arm, and are configured to snap into opposing retention features of the fan tray. The elongated lever arm is thereby attached to the fan tray and pivotable between a closed position folded against an end of the fan tray, and an open position extending from the fan tray. In another embodiment, the handle further includes a bump edge protruding from the end of the elongated lever arm in a direction opposite to the pair of opposing spring tabs. When the handle is in an open position, the bump edge may be used as a fulcrum by which the fan tray may be disengaged from an electronics enclosure by a leveraging action of the lever arm.

19 Claims, 4 Drawing Sheets

SNAP-IN FAN TRAY EJECTOR AND HANDLE

BACKGROUND OF THE INVENTION

1. Field of the Invention

The present invention relates to modular ventilation fan assemblies for electronics enclosures, and more particularly to pivoting ejectors and handles for such assemblies.

2. Description of Related Art

Modular ventilation fan assemblies, sometimes called fan tray assemblies (or more briefly, "fan trays") are used for mounting ventilation fans to electronics enclosures, such as computer enclosures. Conductive enclosures are used to contain electromagnetic interference (EMI) generated by electronic equipment, and ventilation fans are often used for thermal control of their enclosed interior spaces. The fan tray provides for convenient mounting of one or more ventilation fans to the electronics enclosure while maintaining the EMI-shielding integrity of the enclosure. The fan tray may also provide a convenient location for mounting a control circuit for the ventilation fan or fans in the fan tray.

The ventilation fan itself is usually a modular unit that includes a rotor and a motor encased in a plastic housing. As such, it does not provide EMI shielding and may itself be a source of EMI. Fan trays therefore typically provide metal grills on opposite sides of the fan for purposes of safety, while allowing for the passage of air through the fan tray. At the same time, the metal grills and sheet metal walls of the fan tray maintain electromagnetic isolation for the interior of the electronics enclosure and serve as part of the wall thereof.

In some applications, the fan tray has an interface connector at an end of the fan tray. The interface connector may be a socket-type connector that is oriented away from the fan tray to connect with a corresponding pin-type connector mounted to the electronics enclosure. To assemble the fan tray to the electronic enclosure, the fan tray is slid into a port or opening of the enclosure until the interface connector engages the corresponding connector in the electronics enclosure. The fan tray is then retained in the enclosure by the surrounding walls of the port or opening in the enclosure, in cooperation with the frictional engagement of the interface connector to the connector of the enclosure.

To assist with removal of the fan tray from the electronics enclosure, a pivoting grab handle may be provided at an end of the fan tray opposite to the interface connector. When the fan tray is in use, the pivoting grab handle may be folded out of the way against the end of the fan tray. It may then be lifted away from the end of the fan tray, and used as a pull tab to break the frictional engagement of the connectors and extract the fan tray from the electronics enclosure. Such handles have the advantage of being relatively simple to construct and operate, while also being compact and unobtrusive.

Such pivoting handles, however, are also subject to certain disadvantages. One disadvantage is that they require the use of a screw, bolt, rivet, or like fastener to attach the handle to the fan tray and provide a pivot axis, thereby requiring additional inventory for manufacturing and additional operations for assembly. A second disadvantage is that they are somewhat difficult to grasp when they are folded against the end of the fan tray. Still another disadvantage is that no additional leverage is provided by the pivoting action to assist with disengagement of the interface connector, because the handle is simply used as a pull tab. To remove a fan tray using a prior art handle, the user is required to pull with a high initial force to disengage the connectors, and to quickly reduce the pulling force after disengagement occurs to avoid over-accelerating the fan tray. Such manipulations are more cumbersome than is generally desirable.

SUMMARY OF THE INVENTION

The present invention provides a snap-in fan tray ejector and handle that overcomes the limitations of prior art pivoting handles, while retaining their advantages.

Like prior art handles, the ejector and handle of the present invention is compact and inexpensive to make. It may be stamped from sheet metal stock, and when not in use, be made to fold against an end of a fan tray.

In addition, the ejector and handle incorporates several novel features that together provide reduced manufacturing and assembly costs, and greater utility in operation. A need for a fastener such as a screw, bolt, or rivet to attach the ejector and handle to a fan tray is eliminated by configuring the ejector and handle to snap into recesses typically provided by the mounting holes of ventilation fan frames. In an embodiment of the invention, the snap-in action is provided by protruding bushings placed on opposing spring tabs that extend from a central pivot arm of the handle. The protruding bushings may be integrally formed in the sheet metal of the handle by half-shearing the metal using a pin-shaped tool.

The ejector and handle also incorporates a novel bumped edge at an end of the central pivot arm adjacent to the spring tabs. When the ejector and handle is lifted away from the end of the fan tray, the bumped edge engages an adjacent part of the computer housing, providing a fulcrum against which the central pivot arm of the handle can be used as a lever. Thus, leverage can be attained to break the engagement of the interface connector over a relatively short working distance. After the engagement has been broken, the ejector and handle no longer functions as a lever, and may instead be used as a pull tab at a relatively low force level to remove the disengaged fan tray.

The handle may additionally be configured to include an offset portion at an end of the central pivot arm distal from the spring tabs. The offset portion facilitates grasping when the ejector and handle is folded against the end of the fan tray, increasing convenience for the user.

A more complete understanding of the snap-in fan tray ejector and handle will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention provides a snap-in fan tray ejector and handle that overcomes the limitations of prior art pivoting handles for fan trays, while retaining all of their advantages. In the detailed description that follows, like element numerals are used to indicate like elements that appear in one or more of the figures.

Figure 1:
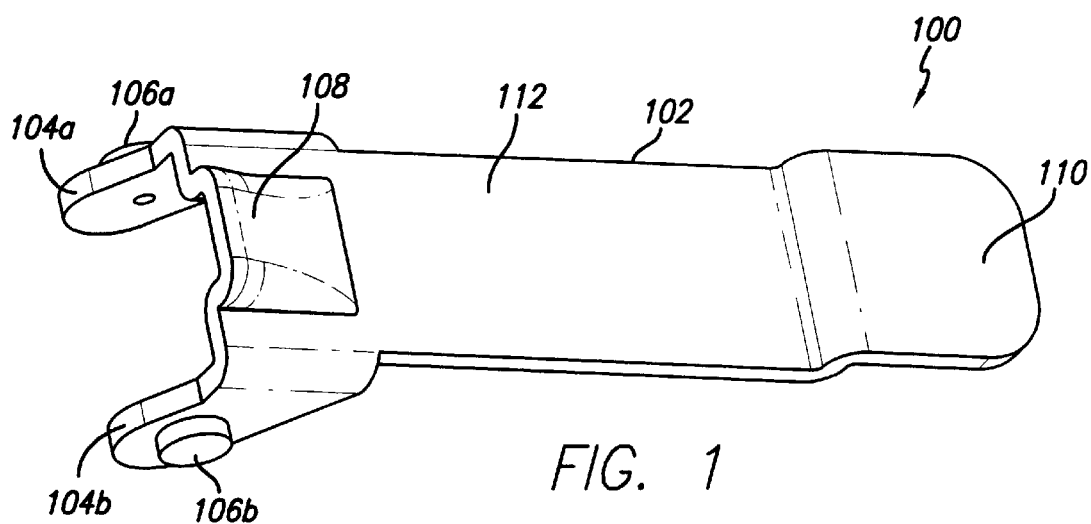
FIG. 1 is a perspective view of an exemplary snap-in fan tray ejector and handle according to the invention.
Figure 2:
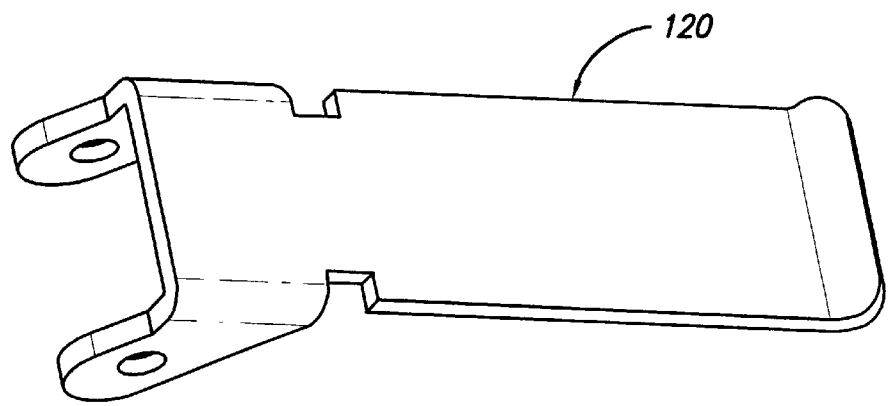
FIG. 2 is a perspective view of a prior art pivoting handle.

An exemplary snap-in fan tray ejector and handle (in brief, "handle") 100 is shown in FIG. 1. The novel aspects and advantages of handle 100 are apparent by comparison with a prior art pivoting handle 120, shown in FIG. 2. Handle 100 comprises an elongated lever arm 102, and a pair of opposing spring tabs 104a, 104b at an end of the lever arm and extending from it. Each spring tab 104a is spaced apart from and substantially parallel to the other spring tab 104b, and both spring tabs 104a, 104b extend normally from lever arm 102. To ensure proper operation of the handle, the spacing between the spring tabs 104a, 104b should be carefully controlled. Calculation of the optimal spacing using a "4 sigma" design method, based on a estimate of tolerances for mating parts to plus or minus four standard deviations, is particularly preferred.

Each spring tab has an integral retention feature configured to snap into opposing retention features of a fan tray. The retention features are configured such that the lever arm may be attached to a fan tray using only the integral retention features, without any use of a separate fastener such as a screw, bolt, rivet, pin, or the like. In an embodiment of the invention, the integral retention features are cylindrical bushings 106a, 106b that are pressed into a surface of the spring tabs 104a, 104b, respectively. Bushings 106a, 106b are oriented to define a pivot axis substantially perpendicular to the long axis of lever arm 102.

Figure 3:
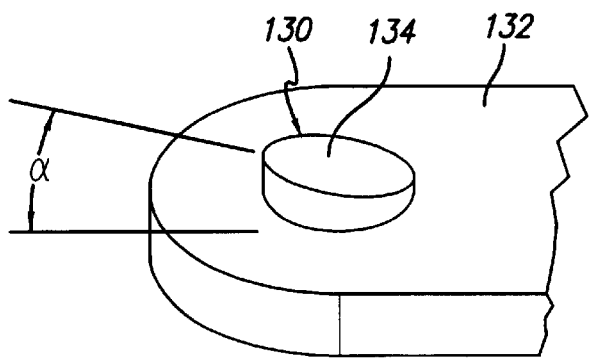
FIG. 3 is a detail view of an exemplary half-shear bushing for use on a spring tab according to the invention.

Handle 100 may be formed from an integral sheet of structural material, such as a steel material. This advantageously permits cost-effective manufacture using stamping and cutting dies with stock sheet materials. Bushings 106a, 106b may be formed in the sheet of structural material by half-shearing the sheet using a pin-shaped tool. FIG. 3 shows a detail view of an exemplary bushing 130 that maybe formed by half-shearing a sheet. In an embodiment of the invention, the outer surface 134 of bushing 130 is substantially parallel to surface 132; i.e., angle α is substantially zero. In other embodiments of the invention, the outer surface 132 may be inclined relative to surface 132. For example, angle a may be between zero and about 45°. Inclining the outer surface 132 may make bushing 130 easier to snap into a retention hole of a fan tray, perhaps at the expense of making bushing 130 more difficult to form.

Referring again to FIG. 1, handle 100 further comprises a bump edge 108 protruding from an end of arm 102 in a direction opposite to the spring tabs 104a, 104b. Advantageously, the bump edge 108 is situated between the spring tabs, and integrally formed of the same sheet as the remainder of handle 100. Bump edge 108 protrudes above surface 112 of arm 102, for providing a fulcrum point against which lever arm 102 may be leveraged during removal of a fan tray from an electronics enclosure. Operation of an exemplary bump edge is described in more detail in connection with FIGS. 8 and 9 below.

Handle 100 further comprises an offset portion 110 at an end of arm 102 distal from spring tabs 104a, 104b. Preferably, offset portion 110 is substantially parallel to the remainder of lever arm 102, so that it will lie substantially parallel to an end of a fan tray when handle 100 is in a closed position with respect to a fan tray.

Figure 4:
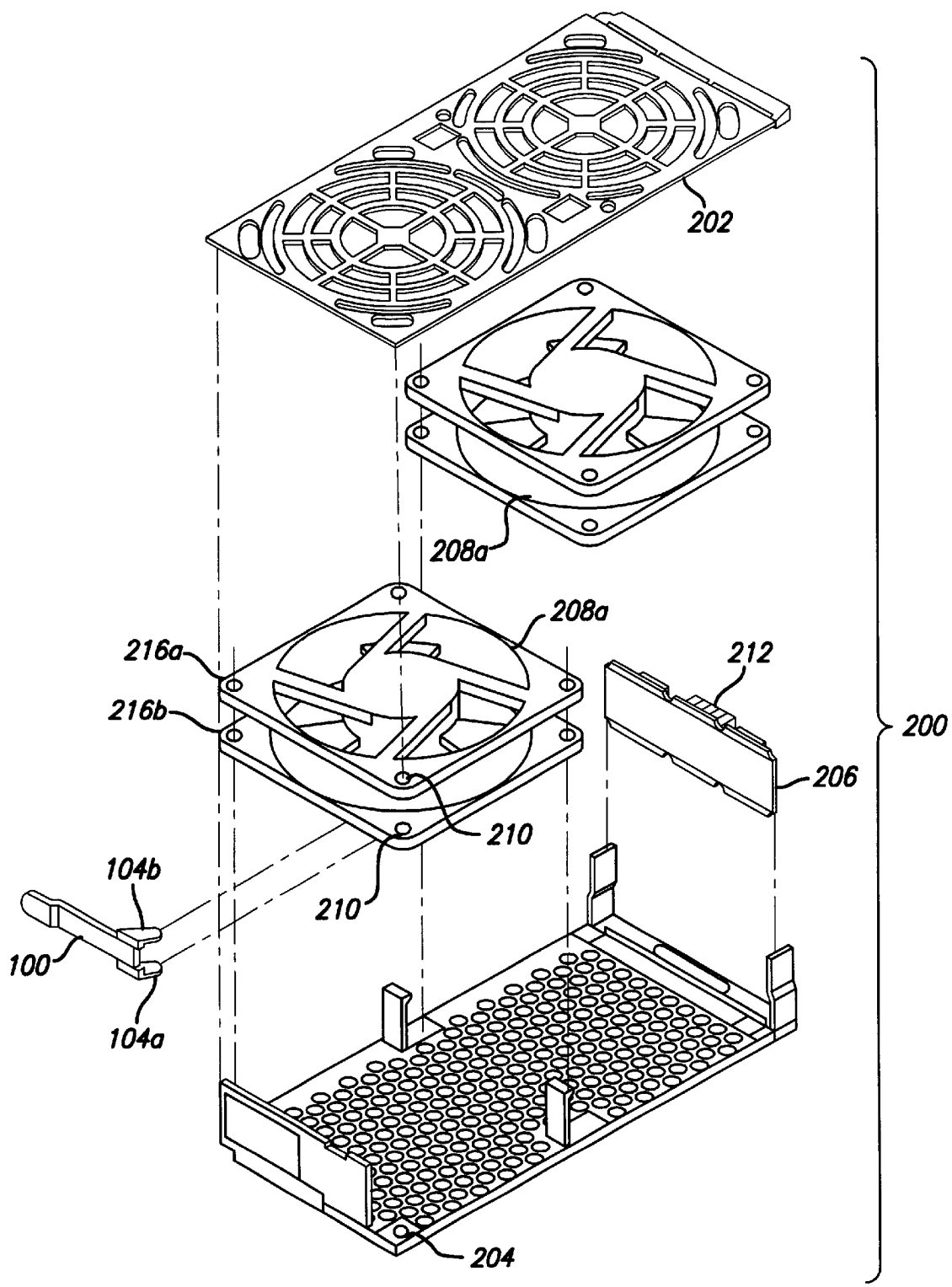
FIG. 4 is an exploded perspective view of an exemplary fan tray assembly incorporating a snap-in handle according to the invention.
Figure 5:
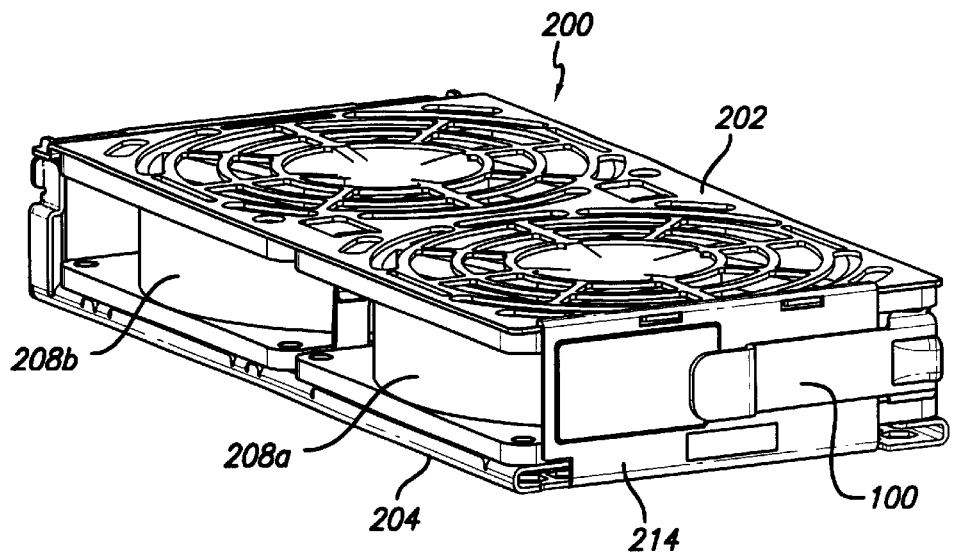
FIG. 5 is a perspective view of the fan tray shown in FIG. 4 as assembled, with the snap-in handle in a closed position.
Figure 6:
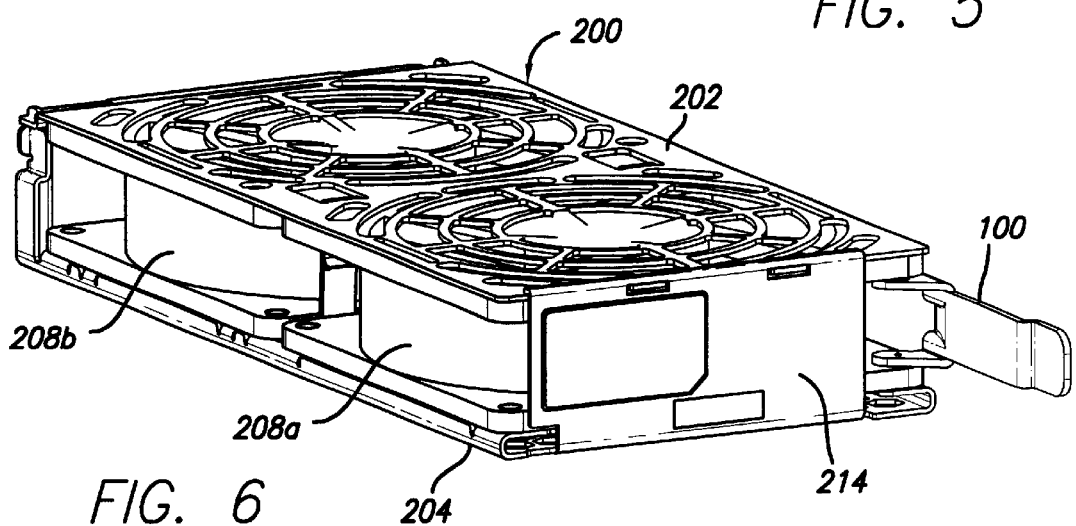
FIG. 6 is a perspective view of the fan tray shown in FIG. 5, with the snap-in handle in an open position.

Assembly and use of handle 100 in connection with an exemplary fan tray assembly 200 is illustrated by FIGS. 4–6. It should be apparent that handle 100 is not limited by the particular fan tray shown, and may be used in conjunction with any suitably configured fan tray. Fan tray 200 comprises outlet grill plate 202, inlet grill plate 204, handle 100, and, interposed between plates 202 and 204, ventilation fans 208a, 208b and circuit board 206. Ventilation fans 208a, 208b are connected by cables (not shown) to circuit board 206. Circuit board 206 is mounted at an end of fan tray 200 opposite to handle 100, and includes an interface connector 212 that extends away from the end of the fan tray. Interface connector 212 is for engaging with a corresponding connector in an electronics enclosure (not shown).

Spring tabs 104a, 104b fit between flanges 216a, 216b of fan 208a, and each bushing 106a, 106b is inserted into one of the mounting holes 210. To assemble handle 100 between flanges 216a, 216b, the spring tabs 104a, 104b are compressed towards one another until bushings 106a, 106b spring or "snap" into place inside of holes 210. Fan 208a is itself fastened to fan tray 200 using fasteners, or by any other suitable method. Thus, assembly of handle 100 to the fan tray may be accomplished without using any separate fastener such as a screw or rivet. In the alternative, handle 100 may be attached to components of fan tray 200 other than fan 208a. Yet another alternative is to provide holes as retention features in spring tabs 104a, 104b, which snap over bushings on a fan or other component of a fan tray.

FIG. 5 shows handle 100 in a closed position, with lever arm 102 adjacent and substantially parallel to end 214 of fan tray 200. After a fan tray is inserted into an electronics enclosure, handle 100 will generally be folded against end 214 as shown. To remove the fan tray from an enclosure, handle 100 is moved to an open position as shown in FIG. 6. In an open position, handle 100 may be used as a lever to disengage an interface connector at an opposite end of the fan tray, or as a pull tab to lift the fan tray from the enclosure.

Figure 7:
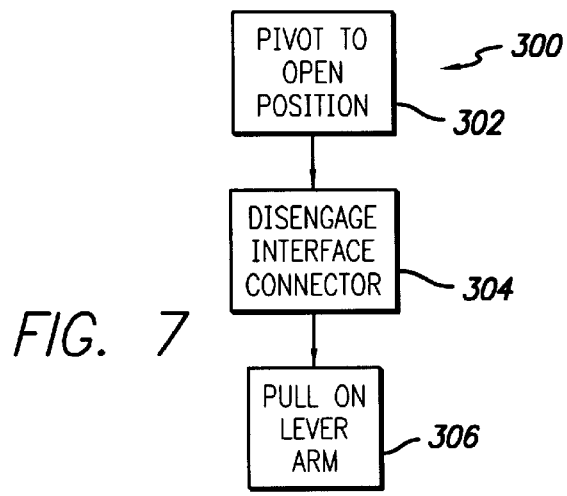
FIG. 7 is a flow diagram showing exemplary steps of a method for ejecting a fan tray using a snap-in handle according to the invention.
Figure 8:
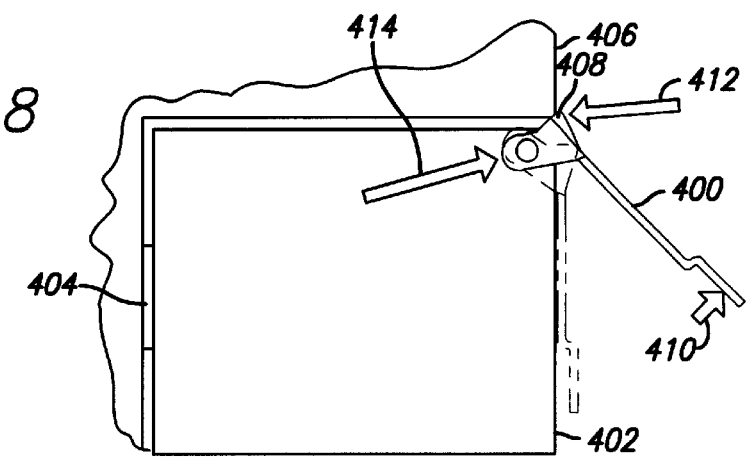
FIG. 8 is a side view of the fan tray, showing operation of an exemplary snap-in fan tray ejector and handle in a leveraging mode.
Figure 9:
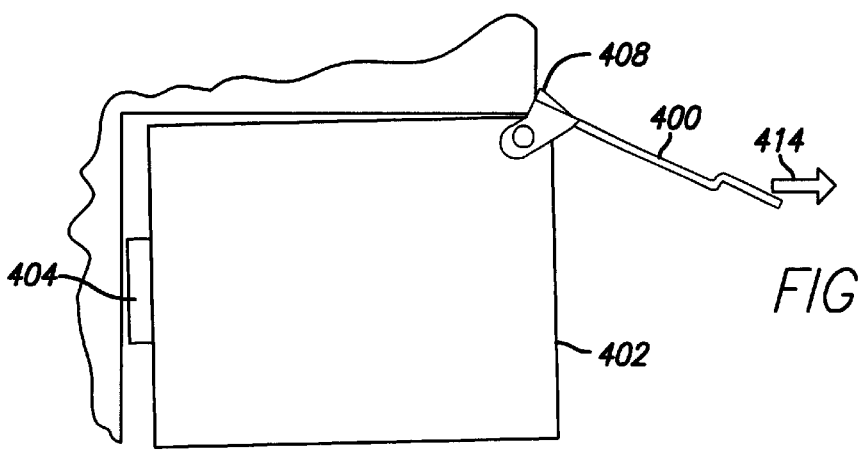
FIG. 9 is a side view of the fan tray, showing operation of the fan tray handle of FIG. 8 in a pull mode.

Exemplary steps of a method 300 for ejecting a fan tray using a snap-in ejector such as handle 100 are shown in FIG. 7. Positions of an exemplary fan tray 402 and handle 400 during steps of method 300 are shown in FIGS. 8 and 9. Method 300 begins with the fan tray 402 fully engaged in an electronics enclosure 406, and the handle 400 folded against the fan tray as shown by the dotted outline 400' of handle 400 in FIG. 8. Connector 404 is engaged in a corresponding connector (not shown) attached to the electronics enclosure. At step 302, the handle is pivoted to an open position until the bump edge 408 contacts a bearing surface of enclosure 406, as shown in FIG. 8. In the absence of a bump edge 408, the end of handle 400 will not reliably contact a bearing surface of enclosure 406, and it will not be possible to achieve a leveraging action between the handle and the electronics enclosure.

At step 302, a force as indicated by arrow 410 in FIG. 8 is applied by a user to the lever arm of handle 400, to disengage the interface connector 404 from the electronics enclosure. Application of force 410 causes the bump edge 408 to exert an amplified force 412 on the electronic enclosure, generally in the direction of the force arrow 412. Force 412 is amplified in proportion to the ratio of the moment arm of force 410 to force 412, as measured from the pivot point of handle 400. The pivot point is in turn determined by the location of the bushings in the spring tabs of the handle, as previously described. In reaction to force 412, a disengagement force 414 is exerted on fan tray 402 at the pivot point of the handle, generally in the direction of arrow 414. With reference to FIG. 8, a horizontal force acting on the fan tray towards the right will tend to disengage the connector 404.

It should be appreciated that the disengagement force 414 is also amplified compared to force 410, as a result of the leveraging provided by the interaction between the bump edge 408 and the electronics enclosure 406. Disengagement of connector 404 is thereby eased. At the same time, force 414 acts over a relatively short range. By the time connector 404 has fully disengaged, and the fan tray 402 has moved to a position such as shown in FIG. 9, the component of force 414 in the disengagement direction has greatly diminished. As a result, the leveraging action of handle 400 during the disengagement step 304 is naturally modulated after disengagement occurs, making the removal process more controllable for a user.

After connector 404 has disengaged from the electronic enclosure as shown in FIG. 9, handle 400 may be used as a pull tab. At step 306, the user applies a pulling force on the lever arm of the handle. An exemplary pulling force is indicated by the arrow 414 of FIG. 9. Removal of fan tray 400 will proceed in the direction of the arrow. To reinsert the fan tray, handle 400 may be folded back to the closed position as shown in FIG. 5, and the fan tray pushed back into the electronic enclosure until connector 404 re-engages.

Figure 10:
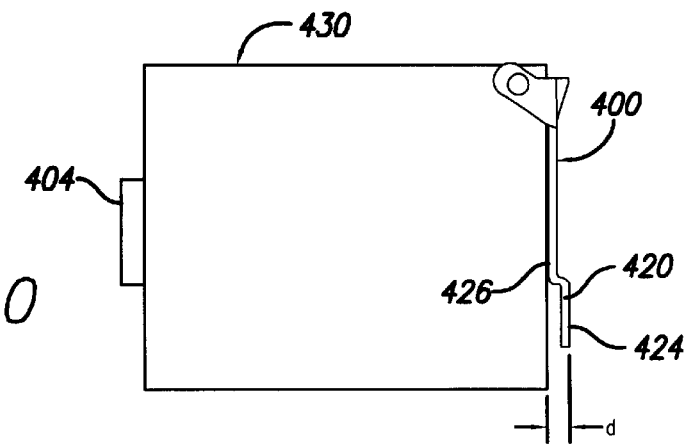
FIG. 10 is a side view of the fan tray, showing the snap-in handle in a closed position.

Referring to FIG. 10, showing the handle 400 in a closed position, the handle includes an offset portion 420, having a outer surface 424 spaced a distance "d" apart from an inner surface 426; i.e., an effective depth of "d." At the same time, the fan tray assembly 430 is designed to be held against a mating connector for connector 404 by contact with a cover of the electronics enclosure of which the fan tray assembly is a part. The cover (not shown) fits over the top of assembly 430 and contacts outer surface 424 when handle 400 is in the closed position. Accordingly, the depth of handle 400 should be carefully selected and controlled, such as by using a suitable statistical tolerancing technique, to ensure a proper fit with an enclosure cover. The depth "d" should be large enough to provide adequate compression for connector 404, but not so large as to prevent the front cover from fitting over the fan tray and sealing the enclosure. A design for "4 sigma" tolerances is preferred.

Having thus described a preferred embodiment of the snap-in fan tray ejector and handle, it should be apparent to those skilled in the art that certain advantages of the within system have been achieved. It should also be appreciated that various modifications, adaptations, and alternative embodiments thereof may be made within the scope and spirit of the present invention. For example, a sheet metal handle of a particular shape has been illustrated, but it should be apparent that the inventive concepts described above would be equally applicable to handles of various different shapes, including handles that are not formed from sheet metal pieces. The invention is further defined by the following claims.

What is claimed is:

1. A handle for ejecting a fan tray from an electronics enclosure, the handle comprising:
   an elongated lever arm;
   a pair of opposing spring tabs disposed at an end of the lever arm and extending therefrom;
   a first bushing protruding from a first of the opposing spring tabs; and
   a second bushing protruding from a second of the opposing spring tabs, wherein the first bushing and the second bushing define a pivot axis substantially perpendicular to a long axis of the elongated lever arm and are configured to snap into opposing retention features of the fan tray, whereby the elongated lever arm is attached to the fan tray and pivotable between a closed position folded against an end of the fan tray, and an open position extending from an end of the fan tray.

2. The handle according to claim 1, further comprising an offset portion of the elongated lever arm at a distal end of the elongated lever arm opposite to the pair of opposing spring tabs, whereby the distal end is offset from and substantially parallel to the end of the fan tray when the elongated lever arm is in the closed position.

3. The handle according to claim 1, wherein each of the pair of opposing spring tabs is substantially parallel to another of the pair of opposing spring tabs, and the pair of opposing spring tabs extends normally from the elongated lever arm.

4. The handle according to claim 1, wherein the handle is formed from an integral sheet of structural material.

5. handle according to claim 4, wherein the structural material comprises steel.

6. The handle according to claim 4, wherein the first bushing and the second bushing are formed by half-shearing the sheet of structural material using a pin-type tool.

7. The handle according to claim 1, further comprising a bump edge protruding from the end of the elongated lever arm in a direction opposite to the pair of opposing spring tabs and from between the pair of opposing spring tabs.

8. The handle according to claim 7, further comprising an offset portion of the elongated lever arm at a distal end of the elongated lever arm opposite to the pair of opposing spring tabs, whereby the distal end is offset from and substantially parallel to the end of the fan tray when the elongated lever arm is in the closed position.

9. The handle according to claim 7, wherein each of the pair of opposing spring tabs is substantially parallel to another of the pair of opposing spring tabs, and the pair of opposing spring tabs extends normally from the elongated lever arm.

10. The handle according to claim 7, wherein the handle is formed from an integral sheet of structural material.

11. The handle according to claim 10, wherein the structural material comprises steel.

12. The handle according to claim 10, wherein the first bushing and the second bushing are formed by half-shearing the sheet of structural material using a pin-type tool.

13. A handle for ejecting a fan tray from an electronics enclosure, the handle comprising:
   an elongated lever arm;
   a pair of opposing spring tabs disposed at an end of the lever arm and extending therefrom, whereby the elongated lever arm is attached to the fan tray and pivotable between a closed position folded against an end of the fan tray, and an open position extending from an end of the fan tray; and a bump edge protruding from the end of the elongated lever arm in a direction opposite to the pair of opposing spring tabs and from between the pair of opposing spring tabs.

14. The handle according to claim 13, further comprising:

a first bushing in a first of the opposing spring tabs;

a second bushing in a second of the opposing spring tabs, wherein the first bushing and the second bushing define a pivot axis substantially perpendicular to a long axis of the elongated lever arm, and are configured to snap into opposing retention features of the fan tray.

15. The handle according to claim 13, further comprising an offset portion of the elongated lever arm at a distal end of the elongated lever arm opposite to the pair of opposing spring tabs, whereby the distal end is offset from and substantially parallel to the end of the fan tray when the elongated lever arm is in the closed position.

16. The handle according to claim 13, wherein each of the pair of opposing spring tabs is substantially parallel to another of the pair of opposing spring tabs, and the pair of opposing spring tabs extends normally from the elongated lever arm.

17. The handle according to claim 13, wherein the handle is formed from an integral sheet of structural material.

18. The handle according to claim 17, wherein the structural material comprises steel.

19. The handle according to claim 17, wherein the first bushing and the second bushing are formed by half-shearing the sheet of structural material using a pin-type tool.

* * * * *